US011227786B2

(12) United States Patent
Taga et al.

(10) Patent No.: US 11,227,786 B2
(45) Date of Patent: Jan. 18, 2022

(54) METHOD OF MANUFACTURING ELECTROSTATIC CHUCK AND ELECTROSTSATIC CHUCK

(71) Applicant: TOKYO ELECTRON LIMITED, Tokyo (JP)

(72) Inventors: Satoshi Taga, Miyagi (JP); Yoshiyuki Kobayashi, Tokyo (JP); Kazuya Nagaseki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 420 days.

(21) Appl. No.: 16/028,699

(22) Filed: Jul. 6, 2018

(65) Prior Publication Data
US 2019/0013230 A1    Jan. 10, 2019

(30) Foreign Application Priority Data

Jul. 7, 2017    (JP) .............................. JP2017-133410

(51) Int. Cl.
*H01L 21/683* (2006.01)
*H01J 37/32* (2006.01)
(Continued)

(52) U.S. Cl.
CPC ............ *H01L 21/6833* (2013.01); *C23C 4/11* (2016.01); *C23C 4/134* (2016.01); *H01J 37/32724* (2013.01); *H01J 2237/002* (2013.01)

(58) Field of Classification Search
CPC .......................................... H01L 21/683–6833
See application file for complete search history.

(56) References Cited

U.S. PATENT DOCUMENTS

| 9,685,356 | B2* | 6/2017 | Parkhe .............. H01L 21/67109 |
| 2002/0004134 | A1* | 1/2002 | Shima ........................ C09J 7/22 |
|  |  |  | 428/354 |

(Continued)

FOREIGN PATENT DOCUMENTS

| JP | H08-319552 A | 12/1996 |
| JP | 2002-231498 A | 8/2002 |

(Continued)

OTHER PUBLICATIONS

Machne translation of JP2002231498. Shizuma, et al "Composite torch type plasma generating method and device". Japan. 2002. (Year: 2002).*

*Primary Examiner* — Peter M Novak
(74) *Attorney, Agent, or Firm* — Weihrouch IP

(57) ABSTRACT

Disclosed is a method of manufacturing an electrostatic chuck configured to attract a substrate by applying a voltage to a first electrode layer. The method includes forming the first electrode layer on a first resin layer on a base and thermally spraying ceramics or a ceramics-containing material on the first electrode layer. The thermally spraying the ceramic or the ceramics-containing material includes transporting powder of a thermal spray material, introduced into a nozzle from a feeder, by a plasma generation gas and spraying the powder from an opening in a tip end portion of the nozzle, dissociating the sprayed plasma generation gas by electric power of 500 W to 10 kW to generate plasma having a common axis with the nozzle, and forming the powder of the thermal spray material into a liquid phase by the generated plasma to form a film on the first electrode layer.

20 Claims, 11 Drawing Sheets

(51) Int. Cl.
   *C23C 4/11*       (2016.01)
   *C23C 4/134*      (2016.01)

(56) References Cited

U.S. PATENT DOCUMENTS

| | | | |
|---|---|---|---|
| 2011/0102965 A1* | 5/2011 | Fujisawa | H01L 21/6833 |
| | | | 361/234 |
| 2016/0233121 A1* | 8/2016 | Kim | H02N 13/00 |
| 2018/0006156 A1* | 1/2018 | Ko | H01L 29/66795 |

FOREIGN PATENT DOCUMENTS

| | | | |
|---|---|---|---|
| JP | 2002231498 A * | 8/2002 | |
| JP | 2003-133394 A | 5/2003 | |
| JP | 2005-064460 A | 3/2005 | |
| JP | 2007-027315 A | 2/2007 | |
| JP | 2007027315 A * | 2/2007 | |
| JP | 2009-200393 A | 9/2009 | |
| WO | 2017/069238 A1 | 4/2017 | |

* cited by examiner

FIG. 3

| PROPERTY | POLYIMIDE | ALUMINA (CERAMICS) | RATIO |
|---|---|---|---|
| DIELECTRIC BREAKDOWN VOLTAGE [kV/mm] | 380 | 18 | 21 |
| RELATIVE DIELECTRIC CONSTANT | 3.3 | 9.9 | 1/3 |

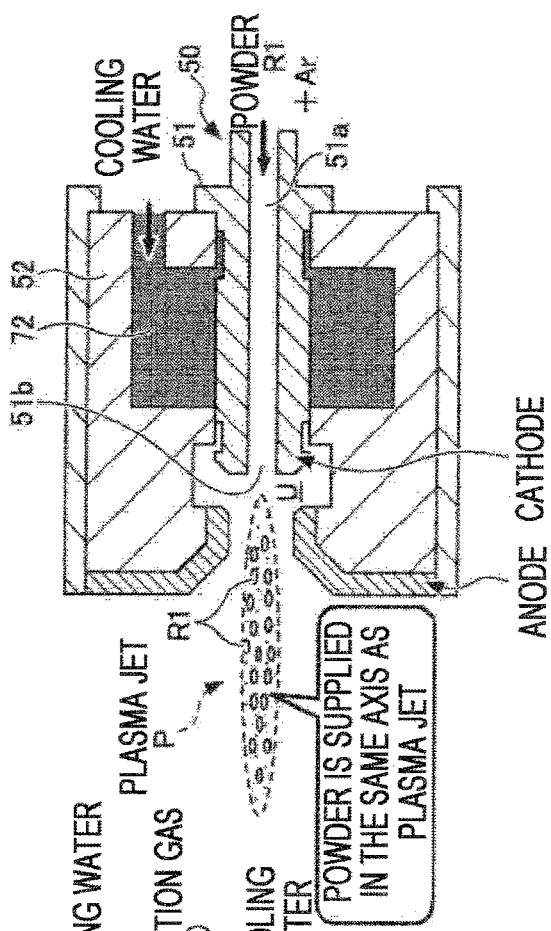
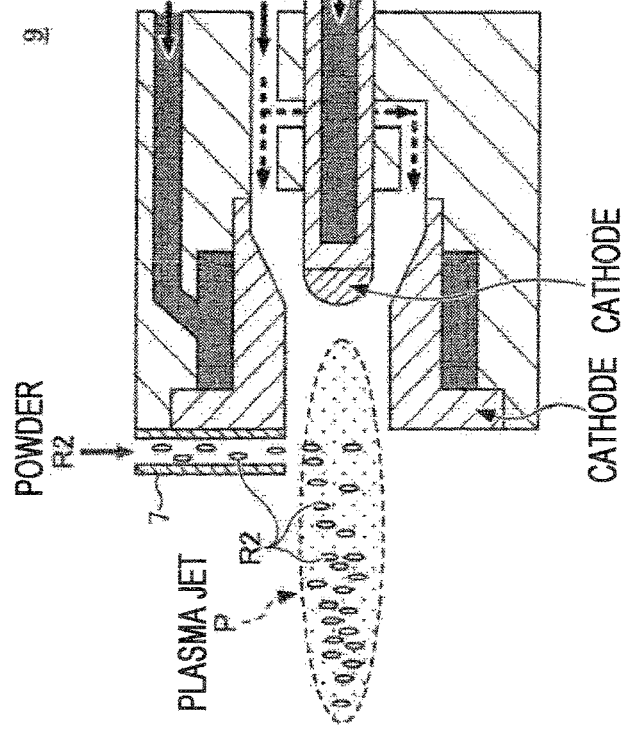

METHOD OF MANUFACTURING ELECTROSTATIC CHUCK AND ELECTROSTSATIC CHUCK

CROSS-REFERENCE TO RELATED APPLICATION

This application is based on and claims priority from Japanese Patent Application No. 2017-133410 filed on Jul. 7, 2017 with the Japan Patent Office, the disclosure of which is incorporated herein in its entirety by reference.

TECHNICAL FIELD

The present disclosure relates to a method of manufacturing an electrostatic chuck and an electrostatic chuck.

BACKGROUND

An electrostatic chuck has been proposed, which applies a voltage to an electrode, and electrostatically attracts and holds a wafer by the Coulomb force, in order to hold the wafer on a placing table (see, e.g., Japanese Patent Laid-Open Publication No. 2009-200393).

The electrostatic chuck adopts a structure in which an electrode layer is included in a dielectric material. The thicker the dielectric material, the lower the electrostatic capacity and the greater the potential difference between the wafer and the placing table, which increases the tendency of inducing discharge on the back surface of the wafer. For example, the electrostatic chuck has, in the base side thereof, a plurality of holes through which pins for lifting the wafer pass, or a plurality of holes, through which a heat transfer gas to be supplied between the wafer and the placing table passes. When the potential difference between the wafer and a base increases, abnormal discharge may occur, for example, in the vicinity of a plurality of holes, which are formed in the vicinity of the back surface of the wafer.

SUMMARY

According to an exemplary embodiment, there is provided a method of manufacturing an electrostatic chuck configured to attract a substrate by applying a voltage to a first electrode layer, the method including forming the first electrode layer on a first resin layer on a base and thermally spraying ceramics or a ceramics-containing material on the first electrode layer, wherein the thermally spraying the ceramic or the ceramics-containing material includes transporting powder of a thermal spray material, introduced into a nozzle from a feeder, by a plasma generation gas and spraying the powder from an opening in a tip end portion of the nozzle, dissociating the sprayed plasma generation gas by electric power of 500 W to 10 kW to generate plasma having a common axis with the nozzle, and forming the powder of the thermal spray material into a liquid phase by the generated plasma to form a film on the first electrode layer.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

BRIEF DESCRIPTION OF THE DRAWINGS

FIG. 3 is a view illustrating physical property values of polyimide and alumina according to the first exemplary embodiment.

FIGS. 11A and 11B are views for comparing a plasma jet according to an exemplary embodiment with a comparative example.

DESCRIPTION OF EMBODIMENT

Figure 1:
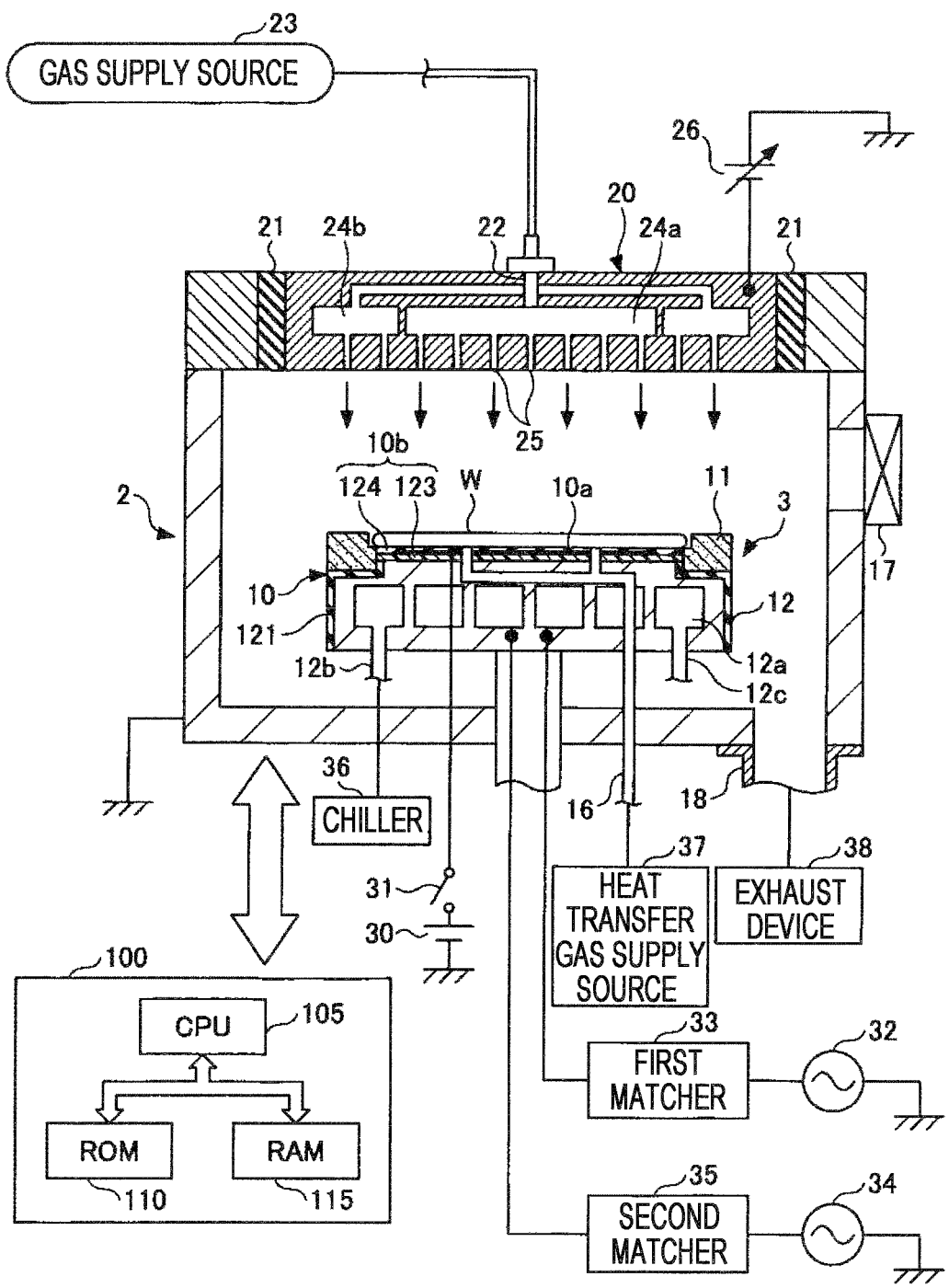
FIG. 1 is a view illustrating an example of a substrate processing apparatus according to an exemplary embodiment.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

In conventional electrostatic chucks, a sintered ceramic material or ceramics in which a thermal spray material having a particle diameter of 30 μm or more is melted and thermally sprayed have been used as the dielectric material. For this reason, it was difficult to reduce the thickness of the dielectric material. As a result, it was impossible to effectively suppress discharge that occurs on the back surface of the wafer.

In accordance with one aspect of the present disclosure, an object of the present disclosure is to provide an electrostatic chuck capable of suppressing discharge that occurs on the back surface of a substrate.

In order to solve the problem described above, according to an exemplary embodiment, there is provided a method of manufacturing an electrostatic chuck configured to attract a substrate by applying a voltage to a first electrode layer, the method including forming the first electrode layer on a first resin layer on a base and thermally spraying ceramics or a ceramics-containing material on the first electrode layer, wherein the thermally spraying the ceramic or the ceramics-containing material includes transporting powder of a thermal spray material, introduced into a nozzle from a feeder,_ by a plasma generation gas and spraying the powder from an opening in a tip end portion of the nozzle, dissociating the sprayed plasma generation gas by electric power of 500 W to 10 kW to generate plasma having a common axis with the nozzle, and forming the powder of the thermal spray material into a liquid phase by the generated plasma to form a film on the first electrode layer.

In the above-described method, the thermal spray material is the ceramics or a composite material in which a metal is added to the ceramics.

In the above-described method, the thermal spray material is any one of $Al_2O_3$, a composite material obtained by adding a metal additive to $Al_2O_3$, $Y_2O_3$, and a composite material obtained by adding a metal additive to $Y_2O_3$.

In the above-described method, the metal additive is titanium, aluminum, or silicon carbide (SiC).

In the above-described method, the powder of the thermal spray material has a particle diameter ranging from 1 μm to 20 μm.

The above-described method further includes forming a second resin layer after the forming the first electrode layer on the first resin layer and before the thermally spraying the ceramics or the ceramics-containing material on the first electrode layer.

In the above-described method, the first resin layer is any one of polyimide, silicone, epoxy, and acryl.

In the above-described method, a combination of the first resin layer and the second resin layer is a combination of any of the same or different types of any one of polyimide, silicone, epoxy, and acryl.

In the above-described method, the ceramics or the ceramics-containing material is thermally sprayed so as to cover the first resin layer.

The above-described method further includes forming a second electrode layer for a focus ring on the first resin layer, wherein the ceramics or the ceramics-containing material is thermally sprayed onto the first electrode layer and the second electrode layer.

In the above-described method, the first resin layer is formed on an upper surface of the base and is not formed on a side surface of the base.

In the above-described method, the ceramics or the ceramics-containing material is thermally sprayed so as to cover the first resin layer and the second resin layer.

The above-described method further includes: forming a second electrode layer for a focus ring on the first resin layer; and forming the second resin layer on the first electrode layer and the second electrode layer, wherein the ceramics or the ceramics-containing material is thermally sprayed onto the second resin layer.

In the above-described method, the first resin layer and the second resin layer are formed on an upper surface of the base and are not formed on a side surface of the base.

According to an exemplary embodiment, there is provided an electrostatic chuck configured to attract a substrate by applying a voltage to a first electrode layer, the electrostatic chuck comprising: a first resin layer on a base; the first electrode layer laminated on the first resin layer; and ceramics or a ceramics-containing material laminated on the first electrode layer, wherein the ceramics or the ceramics-containing material is a layer having a thickness of less than 1 mm, which is thermally sprayed using powder of a thermal spray material having a particle size ranging from 1 μm to 20 μm.

According to an exemplary embodiment, there is provided a method of manufacturing an electrostatic chuck configured to attract a substrate by applying a voltage to a first electrode layer. The method includes: forming the first electrode layer on a first resin layer on a base; forming a second resin layer; and thermally spraying ceramics or a ceramics-containing material on the first electrode layer. The thermally spraying the ceramic or the ceramics-containing material includes: transporting powder of a thermal spray material, introduced into a nozzle from a feeder, by a plasma generation gas, and spraying the powder from an opening in a tip end portion of the nozzle; dissociating the sprayed plasma generation gas by electric power of 500 W to 10 kW to generate plasma having a common axis with the nozzle; and forming the powder of the thermal spray material into a liquid phase by the generated plasma to form a film on the first electrode layer According to one aspect, it is possible to provide an electrostatic chuck capable of suppressing discharge that occurs on the back surface of a substrate.

Hereinafter, exemplary embodiments of the present disclosure will be described with reference to the accompanying drawings. In addition, in this specification and the drawings, substantially the same components will be denoted by the same reference numerals, and a redundant description thereof will be omitted.

[Overall Configuration of Substrate Processing Apparatus]

First, an example of a substrate processing apparatus 1 will be described with reference to FIG. 1. The substrate processing apparatus 1 according to the present exemplary embodiment is a capacitively coupled parallel flat plate type substrate processing apparatus, and includes a processing container (chamber) 2 having a substantially cylindrical shape. An alumite processing (anodizing processing) is performed on the inner surface of the processing container 2. The inside of the processing container 2 is formed as a processing chamber in which a plasma processing such as, for example, an etching processing or a film forming processing is performed by plasma.

The placing table 3 is configured to place thereon a semiconductor wafer (hereinafter referred to as "wafer"), which is an example of a substrate. The placing table 3 is formed of, for example, aluminum (Al), titanium (Ti), or silicon carbide (SiC). The placing table 3 also functions as a lower electrode.

On the upper side of the placing table 3, an electrostatic chuck (ESC) 10 is provided in order to electrostatically attract the wafer W. The electrostatic chuck 10 has a structure in which an electrode layer 10a is sandwiched between dielectric layers 10b. A direct current (DC) power supply 30 is connected to the electrode layer 10a. When a DC voltage is applied from the DC power supply 30 to the electrode layer 10a by the opening and closing of a switch 31, the wafer W is attracted to the electrostatic chuck 10 by the Coulomb force.

An annular focus ring 11 is placed on the outer peripheral side of the electrostatic chuck 10 so as to surround the outer edge portion of the wafer W. The focus ring 11 is formed of, for example, silicon, and functions to converge plasma toward the surface of the wafer W in the processing container 2 and improve the efficiency of a plasma processing.

The lower side of the placing table 3 is formed of a base 12, and thus, the placing table 3 is held on the bottom portion of the processing container 2. A coolant flow path 12a is formed inside the base 12. A cooling medium (hereinafter also referred to as "coolant") such as, for example, cooling water or brine, output from a chiller 36, flows to and circulates in a coolant inlet pipe 12b, the coolant flow path 12a, and a coolant outlet pipe 12c. The placing table 3, formed of a metal, dissipates heat and is cooled by the coolant circulating as described above.

A heat transfer gas supply source 37 supplies a heat transfer gas such as, for example, He gas to a gap between the surface of the electrostatic chuck 10 and the back surface of the wafer W through a heat transfer gas supply line 16. With such a configuration, the temperature of the electrostatic chuck 10 is controlled by the coolant circulating in the coolant flow path 12a and the heat transfer gas supplied to the back surface of the wafer W, so that the wafer W is controlled to a predetermined temperature.

A first high frequency power supply 32 is connected to the placing table 3 via a first matcher 33 to supply high frequency power HF for the generation of plasma of a first frequency. In addition, a second high frequency power supply 34 is connected to the placing table 3 via a second matcher 35 to supply high frequency power LF for the generation of a bias voltage of a second frequency. The first frequency may be, for example, 40 MHz. In addition, the second frequency may be lower than the first frequency, and may be, for example, 13.56 MHz. In the present exemplary embodiment, the high frequency power HF is applied to the placing table 3, but may be applied to a gas shower head 20.

The first matcher 33 functions to apparently match the internal impedance of the first high frequency power supply 32 with a load impedance while plasma is generated in the processing container 2. The second matcher 35 functions to apparently match the internal impedance of the second high frequency power supply 34 with the load impedance while plasma is generated in the processing container 2.

The gas shower head 20 is attached so as to close an opening in the ceiling portion of the processing container 2 via a shield ring 21, which covers the outer edge portion thereof. A variable DC power supply 26 is connected to the gas shower head 20, and a negative DC voltage is output from the variable DC power supply 26. The gas shower head 20 may be formed of silicon. The gas shower head 20 also functions as a counter electrode (upper electrode) that faces the placing table 3 (lower electrode).

The gas shower head 20 is formed with a gas introduction port 22, through which a gas is introduced. A gas diffusion chamber 24a on the center side and a gas diffusion chamber 24b on the edge side, which are branched from the gas introduction port 22, are provided inside the gas shower head 20. A gas, output from a gas supply source 23, is supplied to the gas diffusion chambers 24a and 24b through the gas introduction port 22, and is diffused in the gas diffusion chambers 24a and 24b so as to be introduced from a plurality of gas supply holes 25 toward the placing table 3.

An exhaust port 18 is formed in the bottom surface of the processing container 2, and the inside of the processing container 2 is evacuated by an exhaust device 38, which is connected to the exhaust port 18. Thereby, the inside of the processing container 2 is maintained at a predetermined degree of vacuum. A gate valve 17 is provided on the sidewall of the processing container 2. The gate valve 17 is opened and closed when the wafer W is carried into the processing container 2, or carried out from the processing container 2.

The substrate processing apparatus 1 is provided with a control device 100, which controls an operation of the entire apparatus. The control device 100 includes a central processing unit (CPU) 105, a read only memory (ROM) 110, and a random access memory (RAM) 115. The CPU 105 executes a desired plasma processing such as, for example, etching according to a recipe stored in a storage area of, for example, the RAM 115. For example, a process time, a pressure (exhaust of gas), a high-frequency power or voltage, various gas flow rates, the temperature in the processing container (e.g., the temperature of the upper electrode, the temperature of the sidewall of the processing container, the temperature of the wafer W, and the temperature of the electrostatic chuck), and the temperature of the coolant output from the chiller 36 are set in the recipe. In addition, the recipe and a program used by the control device 100 may be stored in a hard disk or a semiconductor memory. In addition, for example, the recipe may be set in and read out from a predetermined position in a state of being stored in a storage medium, which is readable by a portable computer such as, for example, a CD-ROM or a DVD.

When a plasma processing such as, for example, etching or film formation is executed, the opening and closing of the gate valve 17 is controlled, and the wafer W is carried into the processing container 2 and is placed on the placing table 3. When a DC voltage having a positive or negative polarity is applied from the DC power supply 30 to the electrode layer 10a, the wafer W is electrostatically attracted to and held by the electrostatic chuck 10.

During a process, a desired gas is supplied from the gas supply source 23 into the processing container 2, and the high frequency power HF is applied from the first high frequency power supply 32 to the placing table 3. The high frequency power LF may be applied from the second high frequency power supply 34 to the placing table 3. A negative DC voltage may be applied from the variable DC power supply 26 to the gas shower head 20. Thereby, plasma is generated when the gas is dissociated above the wafer W, and a plasma processing is performed on the wafer W by the action of plasma.

After the plasma processing, a DC voltage, the positive and negative polarities of which are opposite to those in electrostatic attraction, is applied from the DC power supply 30 to the electrode layer 10a, and the electric charge of the wafer W is removed. After the removal of electric charge, the wafer W is peeled off from the electrostatic chuck 10, and is carried out of the processing container 2 from the gate valve 17.

[Manufacture of Electrostatic Chuck]

Next, a configuration of the electrostatic chuck 10 according to first to sixth embodiments will be described in order with reference to FIGS. 2A to 9.

First Exemplary Embodiment

Figure 2A:
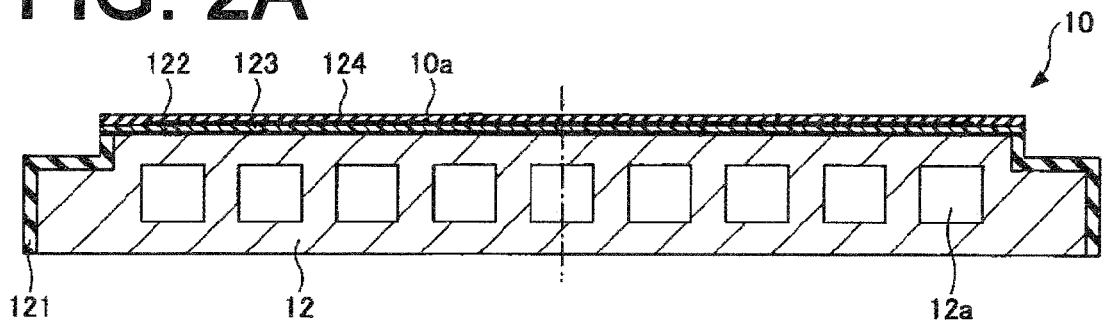
FIGS. 2A to 2C are views each illustrating an exemplary configuration of an electrostatic chuck according to a first exemplary embodiment.
Figure 2B:
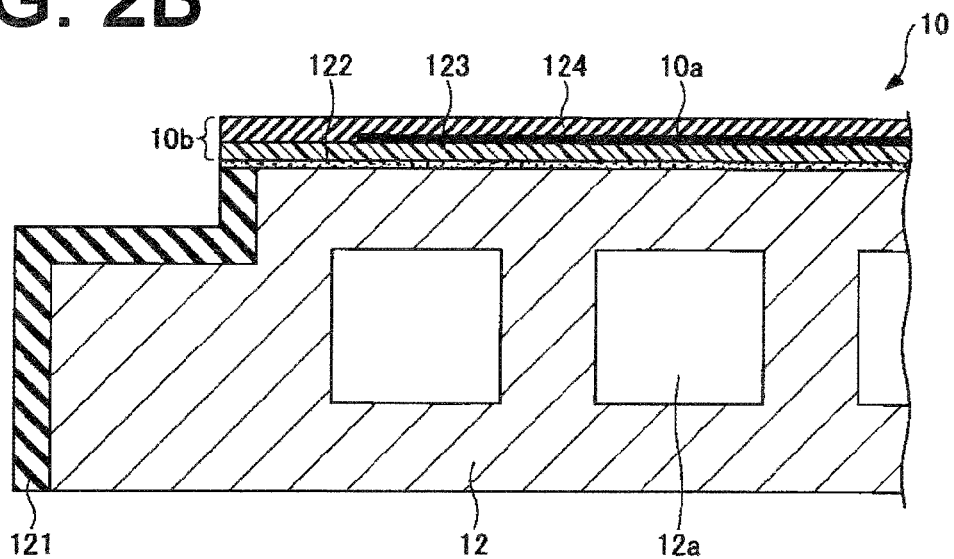

First, a configuration of the electrostatic chuck 10 according to a first exemplary embodiment will be described with reference to FIGS. 2A to 2C. The electrostatic chuck 10 is formed on the base 12. The base 12 has a recessed portion on the outer peripheral side to allow the annular focus ring 11 to be placed in the recessed portion. Referring to FIG. 2B illustrating the left side in FIG. 2A in the enlarged view, the recessed portion on the outer peripheral side of the base 12 and the sidewall of the base 12 are covered with thermal spray ceramics 121.

A polyimide layer 123 is formed on an adhesive layer 122, which is provided on the upper surface of the base 12, so that the polyimide layer 123 is adhered to the base 12. The electrode layer 10a is formed on the polyimide layer 123, and is sandwiched between the polyimide layer 123 and thermal spray ceramics 124. In the first exemplary embodiment, the dielectric layers 10b are formed by the polyimide layer 123 and the thermal spray ceramics 124, and the electrostatic chuck 10 is formed by the electrode layer 10a, the polyimide layer 123, and the thermal spray ceramics 124.

A method of manufacturing the electrostatic chuck 10 according to the first exemplary embodiment will be described. The thermal spray ceramics 121, which are ceramics or a ceramics-containing material, are thermally sprayed onto the recessed portion on the outer peripheral side of the base 12 and the sidewall of the base 12, and the adhesive layer 122 is provided on the upper surface of the base 12.

In a first step, the polyimide layer 123 is formed on the adhesive layer 122 on the base 12. The polyimide layer 123 may be formed by attaching a sheet-shaped polyimide to the adhesive layer 122, or may be coated via coating. In a case of coating, the adhesive layer 122 may not be provided. That is, in a case of coating, the polyimide layer 123 may be directly coated on the base 12, or may be coated on the adhesive layer 122. The polyimide layer 123 is an example of a first resin layer. The first resin layer may be any one of polyimide, silicone, epoxy, and acryl. In the present exemplary embodiment, the polyimide layer 123 and the adhesive layer 122 are formed on the upper surface of the base 12 and are not formed on the side surface of the base 12.

Subsequently, in a second step, the electrode layer 10a is formed on the polyimide layer 123. The electrode layer 10a is an example of a first electrode layer. The first electrode layer is formed of a metal. The metal layer 10a and the metal layer 10b to be described later may be formed using the substrate processing apparatus 1 according to the present exemplary embodiment.

Subsequently, in a third step, the thermal spray ceramics 124, which are ceramics or a ceramics-containing material, are thermally sprayed onto the electrode layer 10a. In the method of manufacturing the electrostatic chuck 10 according to the present exemplary embodiment and second to sixth exemplary embodiments, the thermal spray ceramics are subjected to plasma thermal spraying by a plasma spray apparatus to be described later.

With the method of manufacturing the electrostatic chuck 10 according to the first exemplary embodiment, a polyimide material is used for a lower layer material of the electrode layer 10a, and thermal spray ceramics are used for an upper layer material of the electrode layer 10a. Thereby, the electrostatic chuck 10 may be thinned. For example, the thickness of the thermal spray ceramics 124 of the electrostatic chuck 10 may be about 0.6 mm, and the overall thickness of the electrostatic chuck 10 may be less than 1 mm.

Advantages of forming the first resin layer and the second resin layer to be described later using a polyimide material will be described. The electrostatic capacity C of the electrostatic chuck 10 is calculated from Equation (1) using the relative dielectric constant c of the dielectric layer 10b and the thickness d of the dielectric layer 10b.

$$C = \varepsilon_0 \times \varepsilon \times (S/d) \quad (1)$$

Here, $\varepsilon_0$ is the dielectric constant of vacuum, $\varepsilon$ is a relative dielectric constant, S is the area of the dielectric layer 10b, and d is the thickness of the dielectric layer 10b.

For example, when attempting to secure a certain insulation value [kV], assuming that the thickness of an alumina plate is 1, polyimide may be realized with a thickness of 1/21 of alumina. This is because the dielectric breakdown voltage of polyimide is 21 times the dielectric breakdown voltage of alumina (ceramics), as illustrated in the upper part of FIG. 3.

Therefore, as illustrated in the lower part of FIG. 3, even if the relative dielectric constant of polyimide is 1/3 of the relative dielectric constant of alumina, by comparison based on the same thickness, the electrostatic capacity of the polyimide layer 123 is 7 times (=21/3) of the electrostatic capacity of alumina.

In addition, the thermal spray ceramics 121 and 124 may be thinned to a thickness of about 0.6 mm via plasma thermal spraying by a plasma spray apparatus to be described later. Conventionally, the upper layer material above the electrode layer 10a is formed using a sintered plate of a dielectric material, and has a thickness of at least 1 mm or more, for example, 1 mm to 4 mm. From the above description, the thickness of the conventional electrostatic chuck 10 is at least 1 mm. On the other hand, with the method of manufacturing the electrostatic chuck according to the present exemplary embodiment, the overall thickness of the electrostatic chuck 10 may be less than 1 mm.

Figure 2C:
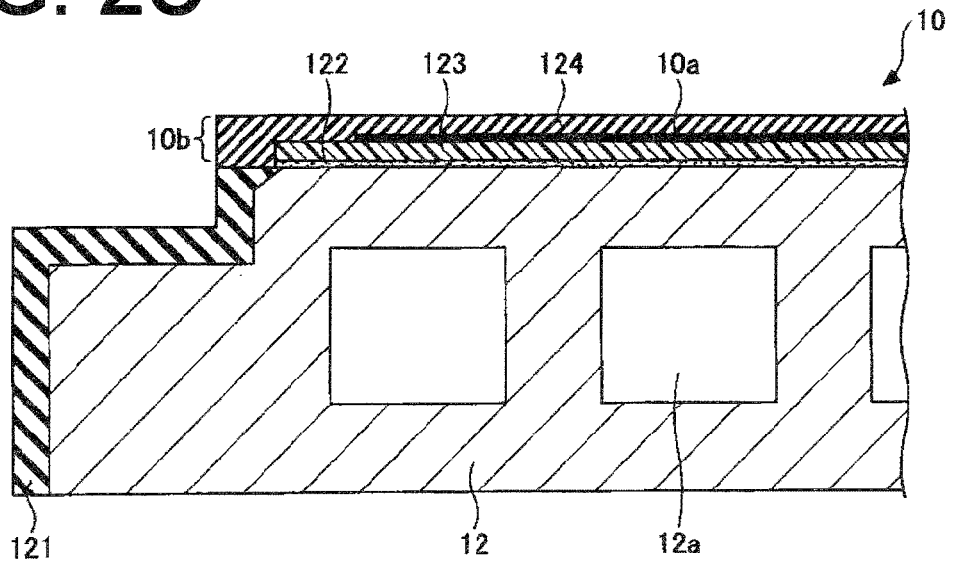

As illustrated in FIG. 2C, the thermal spray ceramics 124 may be thermally sprayed so as to cover the polyimide layer 123 and the adhesive layer 122. According to this, the polyimide layer 123 and the adhesive layer 122, which have plasma resistance lower than that of the thermal spray ceramics 124, are not exposed to plasma. Thereby, it is possible to avoid a reduction in the lifetime of the electrostatic chuck 10 caused when the polyimide layer 123 and the adhesive layer 122 are exposed to and corroded by plasma.

Second Exemplary Embodiment

Next, a configuration of the electrostatic chuck 10 according to a second exemplary embodiment will be described with reference to FIGS. 4A to 4C. The electrostatic chuck 10 according to the second exemplary embodiment has a difference in that two polyimide layers are formed, compared to the configuration of the electrostatic chuck 10 according to the first exemplary embodiment illustrated in FIGS. 2A to 2C.

Figure 4A:
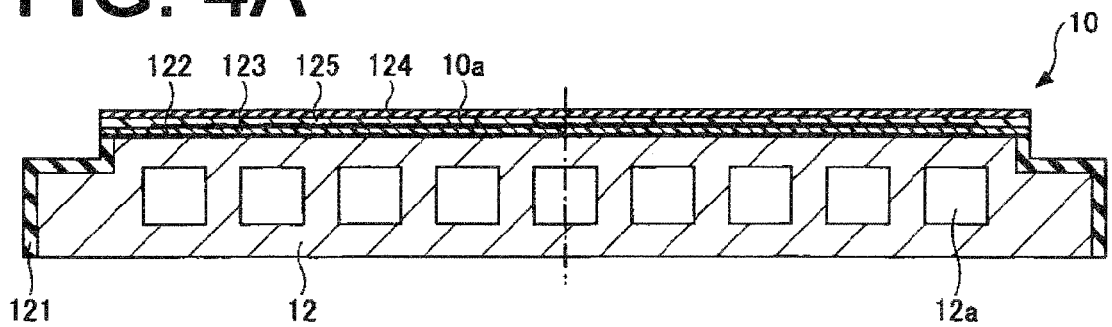
FIGS. 4A to 4C are views each illustrating an exemplary configuration of an electrostatic chuck according to a second exemplary embodiment.
Figure 4B:
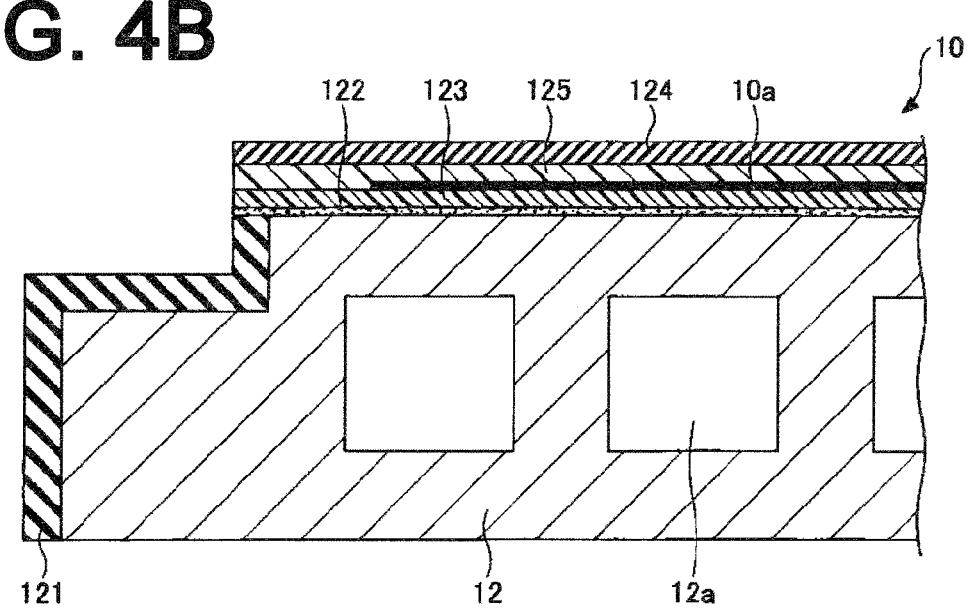
Figure 4C:
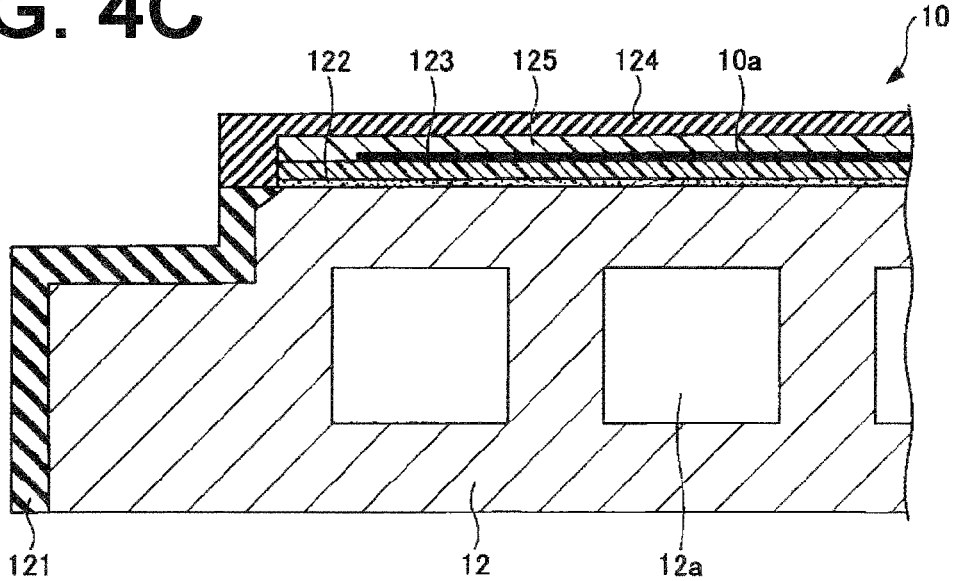

Specifically, in the electrostatic chuck 10 according to the second exemplary embodiment, as illustrated in FIGS. 4A and 4B, a polyimide layer 125 is formed between the polyimide layer 123 and the thermal spray ceramics 124. The polyimide layer 123 according to the present exemplary embodiment is an example of a first resin layer, and the polyimide layer 125 is an example of a second resin layer. In the present exemplary embodiment, by providing two polyimide layers, the electrostatic chuck 10 may be further thinned because polyimide has a high dielectric breakdown voltage.

The polyimide layer 125 may be the same material as or a different material from the polyimide layer 123. Since the polyimide layers 123 and 125 are thin, they may easily maintain adhesion thereof even if they use different materials.

A combination of the first resin layer and the second resin layer may be a combination of any of the same or different types of polyimide, silicone, epoxy, and acryl. In other words, the first resin layer may be any one of polyimide, silicone, epoxy, and acryl, and similarly, the second resin layer may be any one of polyimide, silicone, epoxy, and acryl.

For example, the polyimide layers 123 and 125 may be formed of two layers of polyimide, two layers of silicone, two layers of epoxy, or two layers of acryl. In addition, the polyimide layers 123 and 125 may take a pattern in which a silicone layer is formed on a polyimide layer, a pattern in which an epoxy layer is formed on a polyimide layer, a pattern in which an acryl layer is formed on a polyimide layer, a pattern in which an epoxy layer is formed on a silicon layer, a pattern in which an acryl layer is formed on a silicon layer, or any of all other combinations of materials of the first resin layer and the second resin layer.

A method of manufacturing the electrostatic chuck 10 according to the second exemplary embodiment will be described. For the base 12, to which the thermal spray ceramics 121 and the adhesive layer 122 are attached, in a first step, the polyimide layer 123 is formed on the adhesive layer 122 on the base 12. In a case of coating the polyimide layer 123, the adhesive layer 122 may not be provided. Subsequently, in a second step, the electrode layer 10a is formed on the polyimide layer 123.

Subsequently, after the polyimide layer 125 is formed in a third step, the thermal spray ceramics 124 are thermally sprayed onto the polyimide layer 125 in a fourth step.

With the method of manufacturing the electrostatic chuck according to the second exemplary embodiment, the electrode layer 10a is laminated on two layers of polyimide as a lower layer material, and thermally spraying ceramics are used for an upper layer material. In such a configuration, by providing two layers of polyimide having a high dielectric breakdown voltage, the electrostatic chuck 10 may be further thinned.

Similarly, in the second exemplary embodiment, the polyimide layers 123 and 125 and the adhesive layer 122 are formed on the upper surface of the base 12 and are not formed on the side surface of the base 12. In addition, as illustrated in FIG. 4C, the thermal spray ceramics 124 may be thermally sprayed so as to cover the polyimide layers 123 and 125 and the adhesive layer 122. According to this, the polyimide layers 123 and 125 and the adhesive layer 122, which have plasma resistance lower than that of the thermal spray ceramics 124, are not exposed to plasma. Thereby, the polyimide layers 123 and 125 and the adhesive layer 122 are not exposed to and corroded by plasma, which may prolong the lifetime of the electrostatic chuck 10.

Third Exemplary Embodiment

Figure 5A:
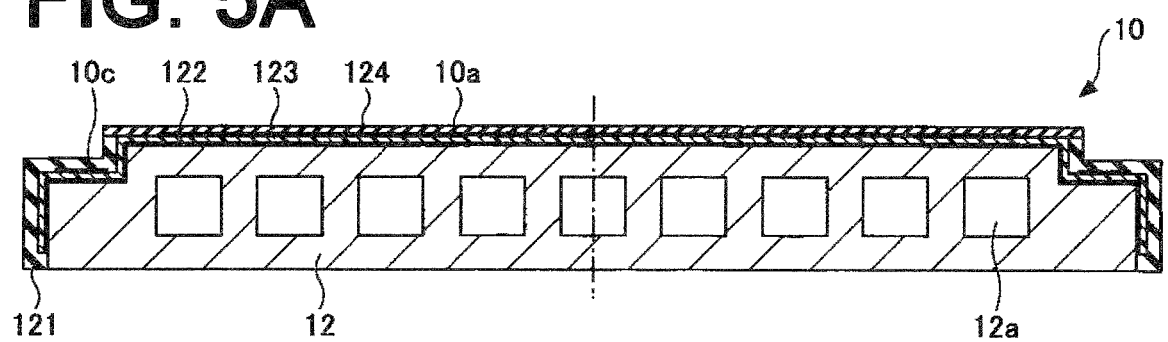
FIGS. 5A and 5B are views illustrating an exemplary configuration of an electrostatic chuck according to a third exemplary embodiment.
Figure 5B:
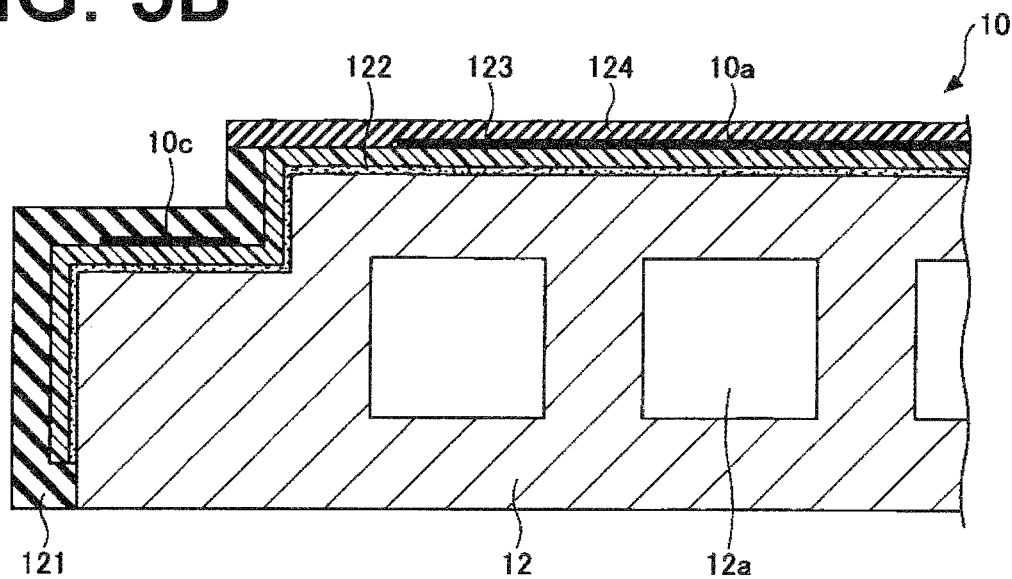

Next, a configuration of the electrostatic chuck 10 according to the third exemplary embodiment will be described with reference to FIGS. 5A and 5B. The electrostatic chuck 10 according to the third exemplary embodiment has differences in that the polyimide layer 123 and the adhesive layer 122 are formed so as to extend to the side surface of the base 12 and the upper surface of the recessed portion and in that an electrode layer 10c for the focus ring 11 is provided separately from the electrode layer 10a, compared to the first exemplary embodiment of FIGS. 2A to 2C.

A method of manufacturing the electrostatic chuck 10 according to the third exemplary embodiment will be described. In a first step, the polyimide layer 123 is formed on the adhesive layer 122, which is formed so as to extend to the side surface of the base 12 and the upper surface of the recessed portion.

Subsequently, in a second step, the electrode layer 10a is formed on the center side of the polyimide layer 123, and the electrode layer 10c is formed on the outer peripheral side of the polyimide layer 123. The electrode layer 10c is an example of a second electrode layer. The second electrode layer is formed of a metal. The electrode layer 10a is an electrode that applies a DC voltage in order to electrostatically attract the wafer W, and the electrode layer 10c is an electrode that applies a DC voltage in order to electrostatically attract the focus ring 11.

Subsequently, in a third step, the thermal spray ceramics 121 are thermally sprayed onto the electrode layer 10c, and the thermal spray ceramics 124 are thermally sprayed onto the electrode layer 10a. The polyimide layer 123 according to the present exemplary embodiment is an example of a first resin layer.

With the method of manufacturing the electrostatic chuck according to the third exemplary embodiment, a polyimide material is used for a lower layer material of the electrode layers 10a and 10c, and thermal spray ceramics are used for an upper layer material of the electrode layers 10a and 10c. Thereby, the electrostatic chuck 10 having the electrode layer 10a for the wafer W and an electrostatic chuck mechanism having the electrode layer 10c for the focus ring 11 may be integrally formed, and the electrostatic chuck 10 and the electrostatic chuck mechanism may be thinned.

Fourth Exemplary Embodiment

Figure 6A:
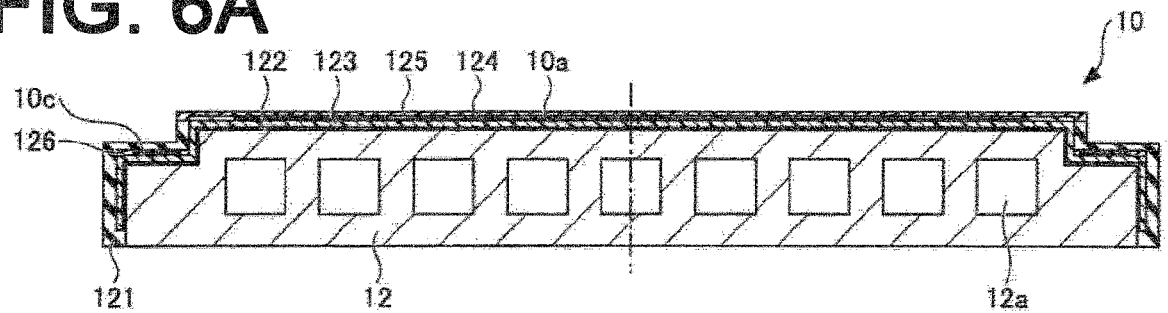
FIGS. 6A and 6B are views illustrating an exemplary configuration of an electrostatic chuck according to a fourth exemplary embodiment.
Figure 6B:
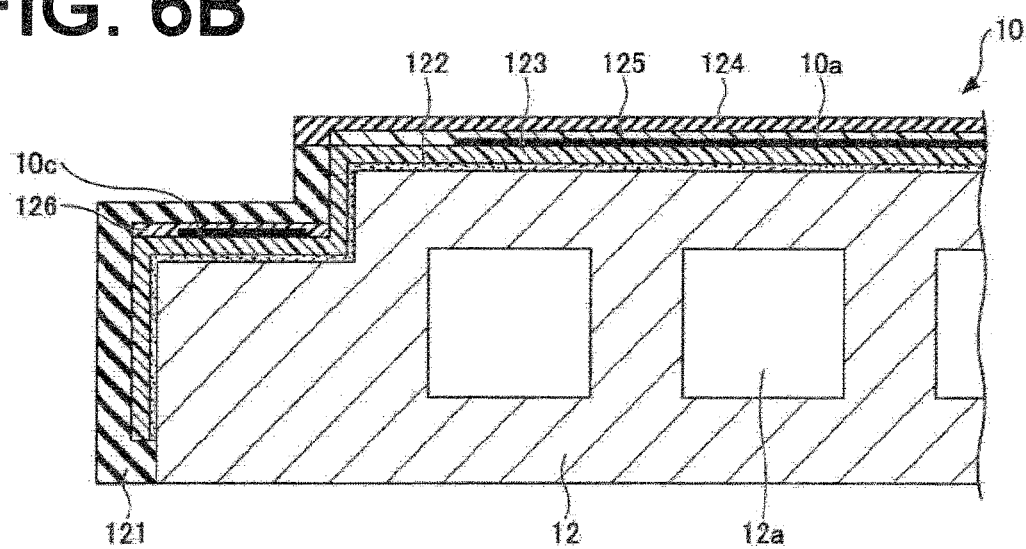

Next, a configuration of the electrostatic chuck 10 according to a fourth exemplary embodiment will be described with reference to FIGS. 6A and 6B. Compared to the third exemplary embodiment of FIGS. 5A and 5B, the electrostatic chuck 10 according to the fourth exemplary embodiment has a difference in that two polyimide layers are formed.

A method of manufacturing the electrostatic chuck 10 according to the fourth exemplary embodiment will be described. In a first step, the polyimide layer 123 is formed on the adhesive layer 122, which is formed so as to extend to the side surface of the base 12 and the upper surface of the recessed portion.

Subsequently, in a second step, the electrode layer 10a is formed on the center side of the polyimide layer 123, and the electrode layer 10c is formed on the outer peripheral side of the polyimide layer 123.

Subsequently, in a third step, a polyimide layer 126 is formed on the electrode layer 10c, and the polyimide layer 125 is formed on the electrode layer 10a. Thereafter, in a fourth step, the thermal spray ceramics 121 are thermally sprayed onto the polyimide layer 126, and the thermal spray ceramics 124 are sprayed onto the polyimide layer 125. The polyimide layer 123 according to the present exemplary embodiment is an example of a first resin layer, and the polyimide layers 125 and 126 are an example of a second resin layer.

With the method of manufacturing the electrostatic chuck according to the fourth exemplary embodiment, two layers of a polyimide material are used for a lower layer material, on which the electrode layers 10a and 10c are laminated, and thermal spray ceramics are used for an upper layer material thereof. Thereby, the electrostatic chuck 10 for the wafer W and the electrostatic attraction mechanism for the focus ring 11 may be integrally formed, and may also be further thinned.

Fifth Exemplary Embodiment

Figure 7A:
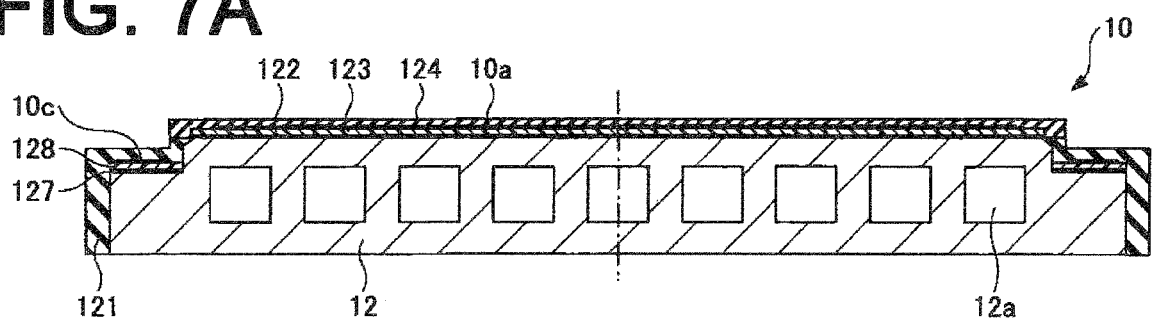
FIGS. 7A and 7B are views illustrating an exemplary configuration of an electrostatic chuck according to a fifth exemplary embodiment.
Figure 7B:
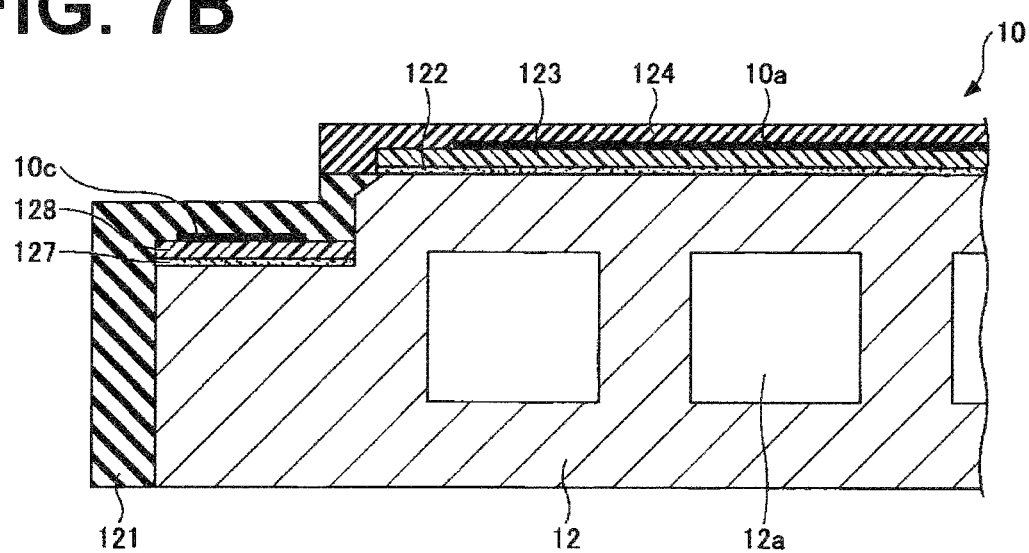

Next, a configuration of the electrostatic chuck 10 according to a fifth exemplary embodiment will be described with reference to FIGS. 7A and 7B. Compared to the third exemplary embodiment of FIGS. 5A and 5B, the electrostatic chuck 10 according to the fifth exemplary embodiment has a difference in that a polyimide layer and an adhesive layer do not exist on the side surface of the base 12, but exist on the entire surface of the base 12.

A method of manufacturing the electrostatic chuck 10 according to the fifth exemplary embodiment will be described. In a first step, the polyimide layer 123 is formed on the adhesive layer 122, which is formed on the upper surface of the base 12, and a polyimide layer 128 is formed on an adhesive layer 127, which is formed separately on the upper surface of the recessed portion of the base 12.

Subsequently, in a second step, the electrode layer 10a is formed on the polyimide layer 123, and the electrode layer 10c is formed on the polyimide layer 128. Subsequently, in a third step, the thermal spray ceramics 121 are thermally sprayed onto the electrode layer 10c, and the thermal spray ceramics 124 are thermally sprayed onto the electrode layer 10a. The polyimide layers 123 and 128 are an example of a first resin layer.

With the method of manufacturing the electrostatic chuck according to the fifth exemplary embodiment, a polyimide layer and an adhesive layer, which are a lower layer material of the electrode layers 10a and 10c, are formed only on the upper surface of the base 12, rather than being formed on the entire surface of the base 12. Thereby, since there is no need to form a polyimide layer and an adhesive layer on the side surface of the base 12, it is possible to more easily perform formation of a polyimide layer and an adhesive layer. As a result, the electrostatic chuck 10 for the wafer W and the electrostatic attraction mechanism for the focus ring 11 may be integrated and may also be thinned, and the structures thereof may be more easily formed.

Sixth Exemplary Embodiment

Figure 8A:
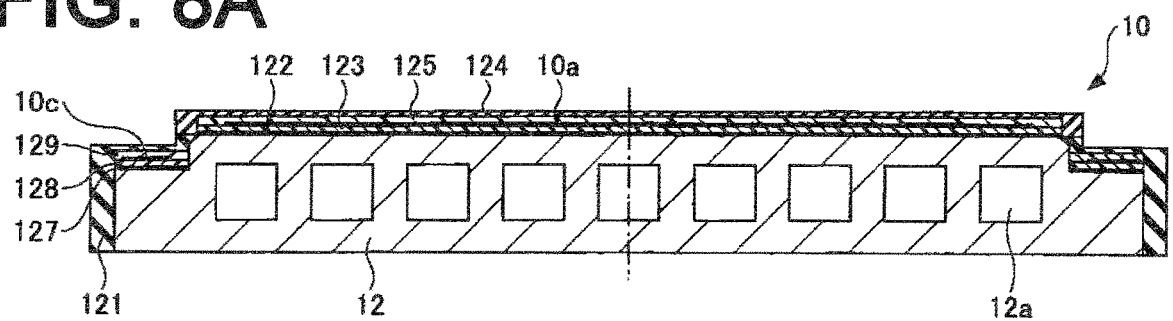
FIGS. 8A and 8B are views illustrating an exemplary configuration of an electrostatic chuck according to a sixth exemplary embodiment.
Figure 8B:
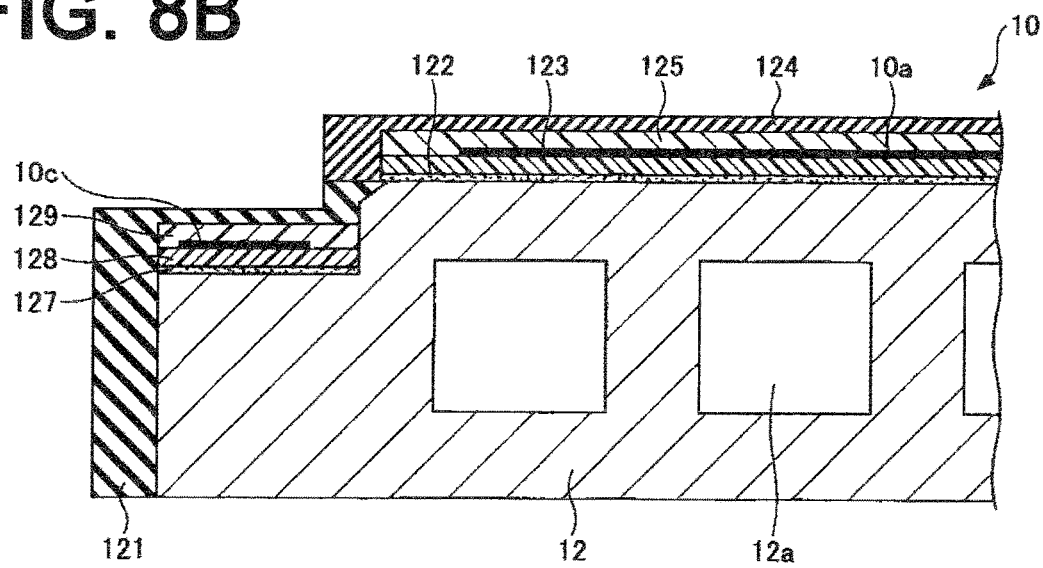

Next, a configuration of the electrostatic chuck 10 according to a sixth exemplary embodiment will be described with reference to FIGS. 8A and 8B. Compared to the fourth exemplary embodiment of FIGS. 6A and 6B, the electrostatic chuck 10 according to the sixth exemplary embodiment has a difference in that a polyimide layer does not exist on the side surface of the base 12, but exists on the entire surface of the base 12.

A method of manufacturing the electrostatic chuck 10 according to the sixth exemplary embodiment will be described. In a first step, the polyimide layer 123 is formed on the adhesive layer 122, which is formed on the upper surface of the base 12, and the polyimide layer 128 is formed on the adhesive layer 127, which is separately formed on the upper surface of the recessed portion of the base 12.

Subsequently, in a second step, the electrode layer 10a is formed on the polyimide layer 123, and the electrode layer 10c is formed on the polyimide layer 128.

Subsequently, in a third step, a polyimide layer 129 is formed on the electrode layer 10c, and a polyimide layer 125 is formed on the electrode layer 10a. Thereafter, in a fourth step, the thermal spray ceramics 121 are thermally sprayed onto the polyimide layer 129, and the thermal spray ceramics 124 are thermally sprayed onto the polyimide layer 125. The polyimide layers 123 and 128 are an example of a first resin layer, and the polyimide layers 125 and 129 are an example of a second resin layer.

With the method of manufacturing the electrostatic chuck according to the sixth exemplary embodiment, two layers of a polyimide material are used for a lower layer material of the electrostatic chuck 10, on which the electrode layers 10a and 10c are laminated, and thermal spray ceramics are used for an upper layer material thereof. Thereby, it is possible to more easily form the electrostatic attraction mechanism for the focus ring 11 and the electrostatic chuck 10 for the wafer W, which are integrated and are further thinned.

[Structure of Electrode Contact Portion and Through Hole]

Figure 9A:
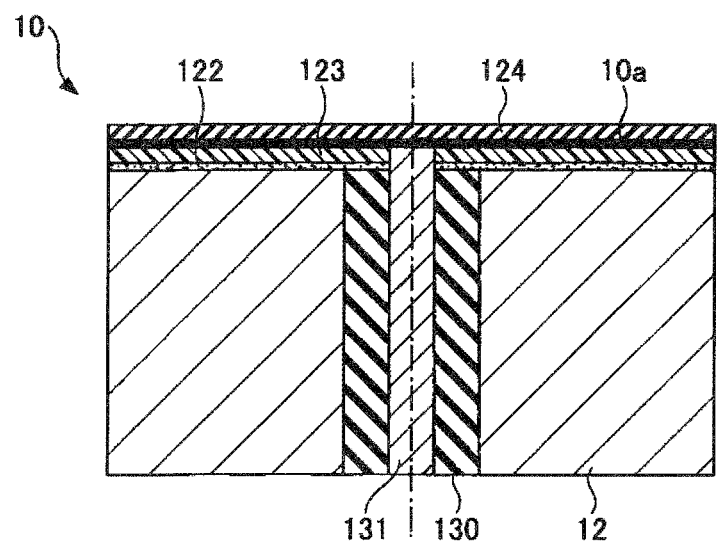
FIGS. 9A and 9B are views illustrating an exemplary structure of an electrode contact portion and a through hole according to an exemplary embodiment.
Figure 9B:
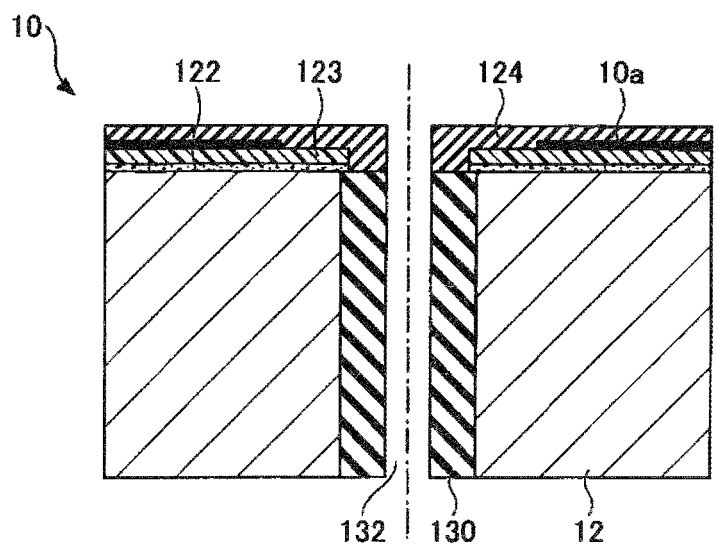

Next, a structure of contact portions with the electrode layers 10a and 10c and the vicinity of a through hole will be described with reference to FIGS. 9A and 9B. FIG. 9A illustrates an exemplary structure of the contact portion with the electrode layer 10a, and FIG. 9B illustrates an exemplary structure of the through hole. The structure of the contact portion with the electrode layer 10c is the same as the structure of the contact portion with the electrode layer 10a, and thus a description thereof is omitted here.

As a method of manufacturing the contact portion with the electrode layer 10a, first, a dielectric sleeve 130 is mounted in an electrode through hole, which is formed in the base 12, and thereafter, the polyimide layer 123 is formed on the adhesive layer 122, which are provided on the base 12 and the sleeve 130. Thereafter, the thermal spray ceramics 124 are thermally sprayed onto the electrode layer 10a, which is formed on the polyimide layer 123. A tip end portion of a power feeding rod 131, which is connected to the DC power supply 30, is inserted into the sleeve 130, and is brought into contact with the electrode layer 10a. Thereby, the contact portion with the electrode layer 10a is formed.

The through hole illustrated in FIG. 9B is, for example, a hole, through which a pin for lifting the wafer W passes, or a hole, through which a heat transfer gas such as, for example, He gas passes, which is formed in the base 12 side. As a method of manufacturing the through hole, for example, the dielectric sleeve 130 is mounted in the electrode through hole, which is formed in the base 12, and thereafter, the polyimide layer 123 is formed on the adhesive layer 122, which are provided on the base 12 and the sleeve 130. Thereafter, the thermal spray ceramics 124 are thermally sprayed onto the electrode layer 10a, which is formed on the polyimide layer 123. The inside of the sleeve 130 forms a through hole 132, and a pin for lifting the wafer W or a heat transfer gas may pass through the through hole 132.

As described above, with the method of manufacturing the electrostatic chuck 10 according to each exemplary embodiment, the electrostatic chuck 10 may be thinned, and the electrostatic capacity thereof may be improved. For example, a combined electrostatic capacity C1 in a case where the dielectric layers of the electrostatic chuck 10 are formed of a polyimide material and silicone will be described.

A polyimide material having a relative dielectric constant of 3.2 is formed to have a thickness of 25 µm on the upper surface of the base 12 having a diameter of 300 mm, and silicone having a relative dielectric constant of 2.7 is formed thereon to have a thickness of 40 µm. In this case, the electrostatic capacity C1 is 27660 pF based on Equation (1).

On the other hand, an electrostatic capacity C2 in a case where an alumina ceramic plate having a relative dielectric constant of 9.9 is formed to have a thickness of 100 µm on the upper surface of the base 12 having a diameter of 300 mm is 6196 pF based on the above Equation (1).

The resistance that makes it difficult for current to flow to the ceramic plate of the electrostatic chuck 10 is indicated by a reactance Xc, and is calculated by using the following Equation (2) based on the frequency f and the electrostatic capacity C.

$$Xc=1/(2\pi fC) \qquad (2)$$

Assuming that the current that flows when a predetermined DC voltage is applied to the electrode of the electrostatic chuck 10 is "I", the voltage Vc applied to the dielectric layers of polyimide and silicone and the ceramic plate is indicated by Equation (3).

$$Vc = Xc \times I \quad (3)$$

From Equations (2) and (3), since the combined electrostatic capacity C1 of the dielectric layers of polyimide and silicone is larger than the electrostatic capacity C2 of the ceramic plate, the reactance Xc may be reduced, and the voltage Vc, i.e. the potential difference between the wafer W and the electrostatic chuck 10 may be reduced.

As described above, with the electrostatic chuck 10 according to each exemplary embodiment, it is possible to remarkably increase the electrostatic capacity by thinning the electrostatic chuck 10. Thereby, the potential difference between the wafer W and the base 12 may be reduced. As a result, with the method of manufacturing the electrostatic chuck 10 according to the present exemplary embodiment, it is possible to provide the electrostatic chuck 10 capable of suppressing discharge that occurs on the back surface of the wafer W.

In addition, with the method of manufacturing the electrostatic chuck 10 according to each exemplary embodiment, a polyimide layer and thermal spray ceramics are used for the dielectric layer, instead of using a sintered ceramic material. Since the sintered ceramic material has a long processing time in a furnace at the time of production, this becomes a factor of prolonging the manufacturing time of the electrostatic chuck 10. Therefore, with the method of manufacturing the electrostatic chuck 10 according to the present exemplary embodiment and each exemplary embodiment to be described later, it is possible to shorten the manufacturing time of the electrostatic chuck 10 compared to the related art.

[Variation]

In the method of manufacturing the electrostatic chuck 10 according to the first to sixth exemplary embodiments, the thermal spray material of the thermal spray ceramics 121 and 124 may be ceramics or a composite material in which a metal is added to ceramics. Specifically, the thermal spray material of the thermal spray ceramics 121 and 124 may be alumina ($Al_2O_3$), a composite material in which a metal additive is added to alumina, yttria ($Y_2O_3$), or a composite material in which a metal additive is added to or yttria. At this time, the metal additive may be titanium, aluminum, or silicon carbide (SiC). For example, a material in which titanium, aluminum, or silicon carbide (SiC) is added to alumina, or a material in which titanium, aluminum, or silicon carbide (SiC) is added to yttria may be used.

[Plasma Spray Apparatus]

Figure 10:
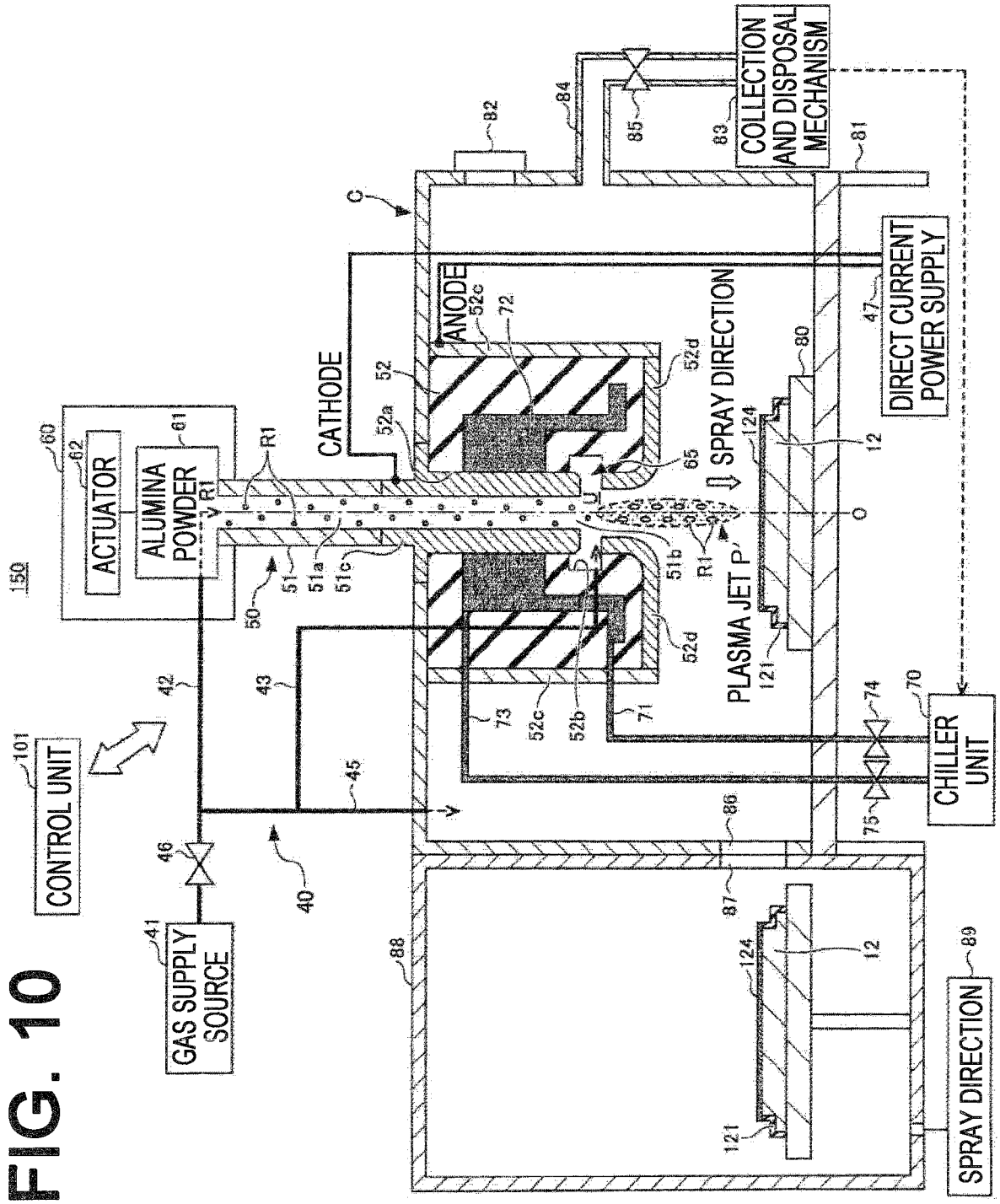
FIG. 10 is a view illustrating an exemplary overall configuration of a plasma spray apparatus according to an exemplary embodiment.

In the electrostatic chuck 10 according to each of the above-described exemplary embodiments, a dielectric material may be manufactured as thin as about 0.6 mm by thermally spraying ceramics. For this reason, the thermal spray ceramics 121 and 124 are formed using a plasma spray apparatus 150 according to an exemplary embodiment of the present disclosure. Hereinafter, an exemplary configuration of the plasma spray apparatus 150 according to the present exemplary embodiment will be described with reference to FIG. 10.

The plasma spray apparatus 150 sprays powder of a thermal spray material from an opening 51b in the tip end portion of a nozzle 51 so as to eject the same toward the base 12 while melting the same by heat of a plasma jet P, which is generated by a high-speed gas, thereby forming the thermal spray ceramics 121 and 124 on the base 12.

In the present exemplary embodiment, as an example of the powder of the thermal spray material, fine alumina powder (hereinafter referred to as "alumina powder R1") having a particle diameter ranging from 1 μm to 20 μm is used. However, the powder of the thermal spray material may be the ceramics or the composite material in which a metal is added to ceramics, which has a particle diameter ranging from 1 μm to 20 μm.

Since the plasma spray apparatus 150 according to the present exemplary embodiment melts the thermal spray material with low energy as described later, film formation may be performed in a state where the powder of the thermal spray material does not sublimate, but exists in a liquid phase. For this reason, as one of advantages of the plasma spray apparatus 150 according to the present exemplary embodiment, even if a specific thermal spray material having a low melting point is used, thermal spray film formation may be performed by using the plasma spray apparatus 150 according to the present exemplary embodiment.

The plasma spray apparatus 150 includes a supply unit 50, a control unit 101, a gas supply unit 40, a plasma generation unit 65, a chamber C, a collection and disposal mechanism 83, and a dry chamber 88. The supply unit 50 includes the nozzle 51 and a feeder 60. Alumina powder R1 is accommodated in a container 61 in the feeder 60. The alumina powder R1 is fine powder having a particle diameter ranging from 1 μm to 20 μm. The feeder 60 supplies the alumina powder R1 to the nozzle 51. The alumina powder R1 is carried inside the nozzle 51 by a plasma generation gas, and is sprayed from the opening 51b in the tip end portion.

The feeder 60 is provided with an actuator 62. The nozzle 51 is a rod-shaped annular member, and a flow path 51a, through which the alumina powder R1 is carried, is formed inside the nozzle 51. The flow path 51a of the nozzle 51 and the inside of the container 61 communicate with each other. By vibrating the container 61 using power of the actuator 62, the alumina powder R1 is introduced into the flow path 51a in the nozzle 51 from the container 61.

The plasma generation gas is supplied, together with the alumina powder R1, to the nozzle 51. The plasma generation gas is a gas for generating plasma, and also functions as a carrier gas that carries the alumina powder R1 from the flow path 51a. In the gas supply unit 40, the plasma generation gas is supplied from a gas supply source 41, is controlled in flow rate via the opening/closing of a valve 46 and a mass flow controller (MFC), and is supplied to the flow path 51a in the nozzle 51 through a pipe 42. As the plasma generation gas, Ar gas, He gas, $N_2$ gas, $H_2$ gas, or a gas obtained by combining these various gases may be used. In the present exemplary embodiment, a case where Ar gas is supplied as the plasma generation gas will be described by way of example.

The nozzle 51 penetrates a body portion 52 of the plasma generation unit 65, and the tip end portion thereof protrudes into a plasma generation space U. The alumina powder R1 is transported to the tip end portion of the nozzle 51 by the plasma generation gas, and is sprayed, together with the plasma generation gas, to the plasma generation space U from the opening 51b in the tip end portion.

The nozzle 51 is formed of a metal. The body portion 52 is formed of an insulation material. The body portion 52 has a through hole 52a in the center portion thereof. A front portion 51c of the nozzle 51 is inserted into the through hole 52a in the body portion 52. The front portion 51c of the nozzle 51 is connected to the DC power supply 47, and also functions as an electrode (cathode), to which current is supplied from the DC power supply 47.

The plasma generation space U is a space that is defined mainly by a recessed portion 52b and a protruding portion 52d of the body portion 52, and the tip end portion of the nozzle 51 protrudes into the plasma generation space U. The protruding portion 52d is connected at one end thereof to a metal plate 52c, which is provided on the outer wall of the body portion 52. The metal plate 52c is connected to the DC power supply 47. Thereby, the metal plate 52c and the protruding portion 52d function as an electrode (anode).

Electric power of 500 W to 10 kW is supplied from the DC power supply 47 to a space between the electrodes, thereby causing discharge between the tip end portion of the nozzle 51 and the protruding portion 52d. Thereby, the plasma generation unit 65 dissociates an argon gas sprayed from the nozzle 51 in the plasma generation space U, and generates argon plasma.

In addition, the argon gas is supplied as a swirling flow to the plasma generation space U. Specifically, the argon gas is supplied from the gas supply source 41, is controlled in flow rate via the opening/closing of the valve 46 and the mass flow controller (MFC), and flows through the pipe 43 inside the body portion 52, thereby being supplied to the plasma generation space U from the lateral direction.

A plurality of supply flow paths is provided in the body portion 52 to introduce the argon gas into the plasma generation space U. Thereby, the argon gas is supplied as a swirling flow to the plasma generation space U in the lateral direction from the plurality of supply flow paths. This prevents diffusion of the generated plasma, and causes the plasma jet P to be linearly deflected. Thereby, the plasma generation unit 65 dissociates the plasma generation gas sprayed from the tip end portion of the nozzle 51, and generates the plasma jet P having a common axis O with the nozzle 51. In addition, in the present exemplary embodiment, the expression "having the common axis" means that the center axis of the supply unit 50 (nozzle 51) and the center axis of the spray direction of the plasma jet coincide with each other, or are substantially in the same direction.

With such a configuration, the alumina powder R1 is ejected toward the surface of the base 12 while melting by heat of the plasma jet P, which is generated by the high-speed argon gas, thereby forming the thermal spray ceramics 124. Similarly, the thermal spraying ceramics 121 are formed on the outer peripheral side of the base 12.

A coolant flow path 72 is formed inside the body portion 52. The coolant supplied from a chiller unit 70 circulates through a coolant pipe 71, a coolant flow path 72, and a coolant pipe 73 by the opening/closing of valves 74 and 75, and returns to the chiller unit 70. Thereby, the body portion 52 is cooled, which prevents the body portion 52 from reaching a high temperature due to the heat of plasma. In addition, a window 82 is attached to the sidewall of the chamber C in order to visually inspect the inside of the chamber C.

[Axis Structure]

As illustrated in FIG. 11B, the plasma spray apparatus 150 having such a configuration according to the present exemplary embodiment has a structure in which the nozzle 51 of the supply unit 50 and the plasma jet P have the common axis. Thereby, the direction in which the alumina powder R1 is ejected and the direction in which the plasma jet P proceeds may be the same. That is, the alumina powder R1 is supplied on the same axis as the plasma jet P. Thereby, the directivity of thermal spraying may be increased so that a thin film of alumina ceramics is formed on a specific surface of the base 12.

On the other hand, in a plasma spray apparatus 9 of a comparative example, as illustrated in FIG. 11A, powder of thermal spray particles is supplied perpendicular to the plasma jet P from a supply pipe 7, which is provided perpendicular to the plasma jet P, which is generated in front of a nozzle 8. Therefore, when the particle diameter of the thermal spray powder R2 is small, the powder R2 may be bounced from the boundary of the plasma jet P, and may not enter the plasma. Thus, in a case of the plasma spray apparatus 9 of the comparative example, as illustrated in the table of FIG. 11A, the particle diameter of the powder R2 of the thermal spray material ranges from 30 μm to 100 μm. On the other hand, the particle diameter of the powder R1 of the thermal spray material, used in the plasma spray apparatus 150 according to the present exemplary embodiment, ranges from 1 μm to 20 μm, as illustrated in the table of FIG. 11B. Therefore, the powder R2 of the thermal spray material used in the comparative example has a particle diameter of about 10 times larger and a volume of about 1000 times larger, compared to the powder R1 of the thermal spray material used in the present exemplary embodiment.

Therefore, in a case of the plasma spray apparatus 9 of the comparative example, in order to melt the powder R2 of the thermal spray material by plasma, the amount of electric power supplied from a DC power supply needs to be two times or more than that of the plasma spray apparatus 150 of the present exemplary embodiment. As a result, an expensive DC power supply having a large maximum amount of electric power is required.

On the other hand, in a case of the plasma spray apparatus 150 of the present exemplary embodiment, the powder R1 of the thermal spray material is fine particles having a particle diameter of about several micrometers, and is gradually supplied in a feed amount of about 1/10 as compared with the comparative example. Thereby, it is possible to reduce the amount of electric power required to melt the powder of the thermal spray material as compared with the related art. In the present exemplary embodiment, since the output amount of electric power of 500 W to 10 kW may be secured, plasma thermal spraying may be performed using the DC power supply 47 having a small maximum amount of electric power. Therefore, an expensive heat source may be unnecessary, power consumption during plasma thermal spraying may be reduced, and the cost thereof may be reduced. In addition, thereby, the plasma spray apparatus 150 of the present embodiment may have a total weight of about 1/10 as compared with the plasma spray apparatus 9 of the comparative example.

In addition, the plasma spray apparatus 150 of the present exemplary embodiment has a structure in which the nozzle 51 of the supply unit 50 and the plasma jet P have the common axis and the direction in which the alumina powder R1 is ejected is the same as the direction in which the plasma jet P proceeds. Therefore, thermal spraying may have directivity and may be performed on the upper surface or the side surface of the base 12 or the corner portion thereof.

[Chamber]

Returning to FIG. 10, the chamber C of the plasma spray apparatus 150 will be described. The chamber C is a cylindrical hollow container, and is formed of, for example, aluminum, stainless steel, or quartz. The chamber C supports the body portion 52 at the ceiling portion thereof, and accommodates the supply unit 50 and the plasma generating portion 65 in a closed space. The base 12 is placed on a stage 80, which is disposed on a bottom portion 81 of the chamber C. In the present exemplary embodiment, the inside of the chamber C is depressurized to a predetermined pressure. However, the inside of the chamber C may not be necessarily depressurized.

The inside of the chamber C is filled with an argon gas. The argon gas is supplied from the gas supply source 41 into the chamber C through a pipe 45. However, the gas that fills the inside of the chamber C is not limited to the argon gas, and any other gas may be used as long as it is an inert gas.

The collection and disposal mechanism 83 suctions the argon gas and the alumina powder inside the chamber C through an exhaust pipe 84 according to the opening and closing of a valve 85, and discards the alumina powder.

A dry chamber 88 is provided adjacent to the chamber C, and forms a closed space that is dehumidified to a predetermined humidity. In addition, the dry chamber 88 is depressurized to a predetermined pressure by an exhaust device 89. However, the dry chamber 88 may not be depressurized. The base 12, on which ceramic thermal spraying has been performed, is transferred from gate valves 86 and 87 to the dry chamber 88, and is transported to a next process.

[Control Unit]

The plasma spray apparatus 150 includes the control unit 101. The control unit 101 controls the plasma spray apparatus 150. The control unit 101 controls the gas supply source 41, the feeder 60 (actuator 62), the DC power supply 47, the chiller unit 70, and the collection and disposal mechanism 83, for example.

The control unit 101 selects a recipe or a program for plasma thermal spraying of a specific thermal spray material, and controls each unit of the plasma spray apparatus 150 based on the recipe or the program.

Specifically, the control unit 101 executes the following respective steps. Thereby, the thermal spray ceramics 121 and 124 having a thickness of about 0.6 mm may be formed on the base 12.

A step of transporting the powder R1 of a thermal spray material such as, for example, alumina, which is introduced into the nozzle 51 from the feeder 60, by the plasma generation gas, and spraying the same from the opening 51b in the tip end portion of the nozzle 51.

A step of dissociating the sprayed plasma generation gas by electric power of 500 W to 10 kW output from the DC power supply 47 so as to generate plasma having a common axis with the nozzle 51.

A step of forming the powder of the thermal spray material into a liquid phase with the generated plasma to form a film of thermal spray ceramics.

The substrate processing apparatus according to the present disclosure may be applied to any type of capacitively coupled plasma (CCP), inductively coupled plasma (ICP), radial line slot antenna, electron cyclotron resonance plasma (ECR), and helicon wave plasma (HWP).

In the present specification, the semiconductor wafer W has been described as an example of the substrate. However, the substrate is not limited thereto, and may be, for example, any of various substrates used for a liquid crystal display (LCD) or a flat panel display (FPD), a photomask, a CD substrate, or a printed circuit board.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of manufacturing an electrostatic chuck, the method comprising:
    forming a first electrode layer on a first resin layer on a base wherein a voltage is applied to the first electrode layer to attract a substrate; and
    thermally spraying ceramics or a ceramics-containing material on the first electrode layer,
    wherein the thermally spraying the ceramic or the ceramics-containing material includes:
        transporting powder of a thermal spray material, introduced into a nozzle from a feeder, by a plasma generation gas, and spraying the powder from an opening in a tip end portion of the nozzle;
        dissociating the sprayed plasma generation gas by electric power of 500 W to 10 kW to generate plasma having a common axis with the nozzle; and
        forming the powder of the thermal spray material into a liquid phase by the generated plasma to form a film on the first electrode layer,
    wherein a diameter of the first resin layer is greater than a diameter of an upper surface of the base.

2. The method of claim 1, wherein the thermal spray material is the ceramics or a composite material in which a metal is added to the ceramics.

3. The method of claim 2, wherein the thermal spray material is any one of $Al_2O_3$, a composite material obtained by adding a metal additive to $Al_2O_3$, $Y_2O_3$, and a composite material obtained by adding a metal additive to $Y_2O_3$.

4. The method of claim 3, wherein the metal additive is titanium, aluminum, or silicon carbide (SiC).

5. The method of claim 1, wherein the powder of the thermal spray material has a particle diameter ranging from 1 μm to 20 μm.

6. The method of claim 1, further comprising:
    forming a second resin layer on the first electrode after the forming the first electrode layer on the first resin layer and before the thermally spraying the ceramics or the ceramics-containing material on the first electrode layer.

7. The method of claim 6, wherein the ceramics or the ceramics-containing material is thermally sprayed so as to cover the first resin layer and the second resin layer.

8. The method of claim 7, further comprising:
    forming a second electrode layer for a focus ring on the first resin layer; and
    forming the second resin layer on the first electrode layer and the second electrode layer,
    wherein the ceramics or the ceramics-containing material is thermally sprayed onto the second resin layer.

9. The method of claim 8, wherein the first resin layer and the second resin layer are formed on an upper surface of the base and are not formed on a side surface of the base.

10. The method of claim 6, wherein a combination of the first resin layer and the second resin layer is a combination of any of the same or different types of polyimide, silicone, epoxy, and acryl.

11. The method of claim 1, wherein the first resin layer is any one of polyimide, silicone, epoxy, and acryl.

12. The method of claim 1, wherein the ceramics or the ceramics-containing material is thermally sprayed so as to further cover an upper surface of the first resin layer.

13. The method of claim 12, further comprising:
    forming a second electrode layer for a focus ring on the first resin layer, wherein the ceramics or the ceramics-containing material is thermally sprayed onto the first electrode layer and the second electrode layer.

14. The method of claim 13, wherein the first resin layer is formed on an upper surface of the base and is not formed on a side surface of the base.

15. The method of claim 12, wherein:
the ceramics or the ceramics-containing material is thermally sprayed so as to further cover a side surface of the first resin layer,
a layer formed by the ceramics or the ceramics-containing material includes a first portion covering the upper surface of the first resin layer and a second portion covering the side surface of the first resin layer, and
the first and second portions are integrally formed without a seam.

16. An electrostatic chuck comprising:
a first resin layer formed on a base;
a first electrode layer laminated on the first resin layer wherein a voltage is applied to the first electrode layer to attract a substrate; and
ceramics or a ceramics-containing material laminated on the first electrode layer,
wherein the ceramics or the ceramics-containing material is a layer having a thickness of less than 1 mm and thermally sprayed using powder of a thermal spray material having a particle size ranging from 1 μm to 20 μm, and
wherein a diameter of the first resin layer is greater than a diameter of an upper surface of the base.

17. A method of manufacturing an electrostatic chuck, the method comprising:
forming a first electrode layer on a first resin layer formed on a base wherein a voltage is applied to the first electrode layer to attract a substrate;
forming a second resin layer on the first electrode layer; and
thermally spraying ceramics or a ceramics-containing material on the second resin layer,
wherein the thermally spraying the ceramic or the ceramics-containing material includes:
transporting powder of a thermal spray material, introduced into a nozzle from a feeder, by a plasma generation gas, and spraying the powder from an opening in a tip end portion of the nozzle;
dissociating the sprayed plasma generation gas by electric power of 500 W to 10 kW to generate plasma having a common axis with the nozzle; and
forming the powder of the thermal spray material into a liquid phase by the generated plasma to form a film on the second resin layer,
wherein a diameter of the first resin layer is greater than a diameter of an upper surface of the base.

18. The method of claim 17, wherein the first resin layer is any one of polyimide, silicone, epoxy, and acryl.

19. The method of claim 17, wherein a combination of the first resin layer and the second resin layer is a combination of any of the same or different types of polyimide, silicone, epoxy, and acryl.

20. The method of claim 17, wherein the ceramics or the ceramics-containing material is thermally sprayed so as to further cover an upper surface of the second resin layer.

* * * * *